United States Patent

Schwartzman

[15] 3,686,539

[45] Aug. 22, 1972

[54] GALLIUM ARSENIDE SEMICONDUCTOR DEVICE WITH IMPROVED OHMIC ELECTRODE

[72] Inventor: Stanley Schwartzman, Somerville, N.J.

[73] Assignee: RCA Corporation, New York, N.Y.

[22] Filed: May 4, 1970

[21] Appl. No.: 34,448

[52] U.S. Cl. ............................ 317/234 R, 317/234 M
[51] Int. Cl. .................................................. H01l 1/14
[58] Field of Search ................................ 317/234, 5.3

[56] References Cited

UNITED STATES PATENTS

| | | | |
|---|---|---|---|
| 3,442,012 | 5/1969 | Murray | 29/590 |
| 3,214,654 | 10/1965 | Armstrong et al. | 317/237 |
| 3,567,508 | 3/1971 | Cox et al. | 117/212 |
| 3,047,780 | 7/1962 | Metz | 317/234 |

*Primary Examiner*—John W. Huckert
*Assistant Examiner*—E. Wojciechowicz
*Attorney*—Glenn H. Bruestle

[57] ABSTRACT

A semiconductor device comprising of semiconducting body of gallium arsenide bonded to an ohmic electrode. The ohmic electrode comprises a tantalum body with a layer of palladium united to it, and with a layer of bonding material united to the palladium and joining the electrode to the semiconductor. The electrode may also be bonded to other semiconductors having a similar coefficient of expansion.

7 Claims, 2 Drawing Figures

Patented Aug. 22, 1972 3,686,539

INVENTOR.
STANLEY SHWARTZMAN
BY D.J. Hoffman
Attorney

GALLIUM ARSENIDE SEMICONDUCTOR DEVICE WITH IMPROVED OHMIC ELECTRODE

BACKGROUND OF THE INVENTION

The invention herein described was made in the course of or under a contract or subcontract thereunder with the Department of the Air Force.

This invention relates to semiconductor devices; and, more particularly, to ohmic electrodes for such semiconductor devices which are capable of operating at high temperatures in excess of 250° C.

In the past, a large number of electrode systems have been developed for semiconductor devices. In each case, the objective was to obtain a good ohmic contact between the semiconductor and the electrode, while at the same time matching their coefficients of expansion. The attaining of this objective has been particularly difficult with high temperature semiconductor devices. At high operating temperatures, even a slight difference in the coefficients of expansion between the device and the electrode will cause the electrode to break away from the device; and the hot strength of the brazed, soldered or diffusion bonded joint is very poor.

Heretofore, there has not been an adequate electrode for high temperature gallium arsenide devices due to expansion mismatch problems. It is known that tantalum has a coefficient of expansion which closely matches that of gallium arsenide, and from that viewpoint, it should make an ideal electrode for such devices. However, it has not been possible to make a good direct ohmic contact between gallium arsenide and tantalum. Tantalum oxidizes readily, and it inherently has an impervious oxide film on its surface which prevents the formation of a good ohmic contact. Thus, it has been necessary to use gold or a gold base alloy as a flux or preform to bond the tantalum to the gallium arsenide because it has been the only suitable metal which could penetrate the oxide film. However, the gold also diffuses rapidly and irregularly into the semiconductor body; and, as a result, it quickly shorts the junctions and destroys the electrical characteristics of the device.

DESCRIPTION OF THE PREFERRED EMBODIMENTS

Figure 1:
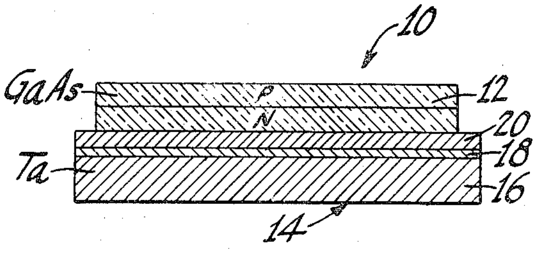
FIG. 1 is a cross-sectional view of a semiconductor device of the present invention.

FIG. 1 is a cross-sectional view of a semiconductor device 10 illustrating one embodiment of the present invention. The present device 10 illustrates part of a power rectifier; however, the invention is also applicable to other high temperature devices, such as power transistors. The device 10 comprises a semiconducting body of gallium arsenide 12 having a PN junction therein, and it is joined to an ohmic electrode assembly 14. The ohmic electrode assembly 14 includes a tantalum body 16, a layer of palladium 18 united to the surface of the tantalum body 16, and a layer 20 of bonding material united to the palladium layer 18. The bonding layer 20 is also united to the gallium arsenide body 12, and it thereby joins the electrode assembly 14 to the gallium arsenide body 12.

The palladium layer 18 is firmly bonded to the tantalum body 16 to provide a good, low resistance, electrical contact with the tantalum. Although it has not been possible to make an adequate bond to the tantalum in the past, an effective method for doing so is disclosed in the example below.

Additionally, the palladium layer 18 provides the tantalum body 16 with a relatively oxide-free surface which then can easily be bonded to the gallium arsenide body 12 by a large number of materials other than gold. The layer of bonding material 20 may be selected from most solders, brazers and diffusion materials; however, it is suggested that a silver diffusion bonded layer 20 should preferably be used because it has a high melting point, and it adheres well to both members without diffusing into the gallium arsenide and without forming low melting alloys.

Also, the present invention is not limited to gallium arsenide devices. It can also be used with other semiconductor materials having a similar coefficient of expansion, such as gallium phosphide and gallium-arsenide-phosphide. Since the type of bonding material is not particularly critical, its composition may be selected to provide the optimum bond between the particular semiconductor being used and the palladium layer 18.

Figure 2:
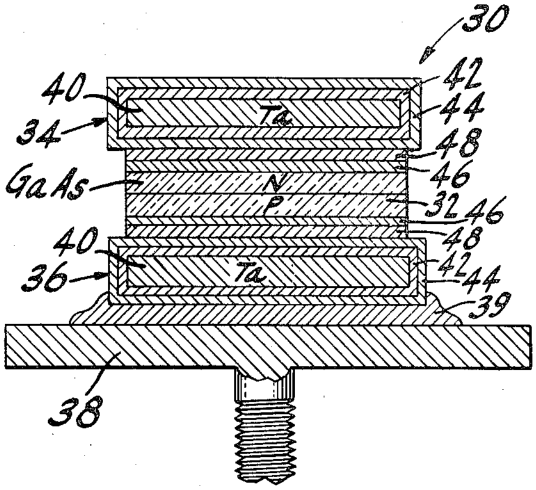
FIG. 2 is a cross-sectional view of a modified semiconductor device of the present invention mounted on a heat sink.

FIG. 2 is a cross-sectional view of a mounted semiconductor device 30 illustrating another embodiment of the present invention. The device 30 is similar to the device 10 of FIG. 1, and it comprises a semiconducting body of gallium arsenide bonded to a pair of opposed electrodes 34 and 36. The bottom electrode 36 is fastened to a heat sink 38 by a layer of solder 39. Typically, the heat sink 38 is made of copper, or brass, or some other good heat conducting metal; and it is joined to the electrode 36 by any good commercial solder 39. This provides a good metal-metal bond with a layer of solder in between, and it will easily withstand the high temperature expansions.

The electrodes 34 and 36 are the same as the electrode 14 of FIG. 1, and they include a tantalum body 40 with a layer of palladium 42 and a layer of solder 44 disposed thereon. However, the gallium arsenide body 32 is slightly different, and its electrode surfaces are first coated with a layer of palladium 46, and then coated with a layer of bonding material 48 which may, for convenience, be made of the same material as the layers 44. The adjacent bonding layers 44 and 48 are then bonded together and serve to join the electrodes 34 and 36 to the gallium arsenide body 32.

The additional palladium layer 46 disposed on the surfaces of the gallium arsenide body 32 provides an improved ohmic contact to the gallium arsenide, and further helps to insure that the solder does not diffuse into the semiconductor. The palladium layers 46 can also be deposited by the method described in the example below. In the present device 30, a double bonding layer 44 and 48 is used to bond the electrode to the semiconductor; however, a single solder layer could also be used. The double solder layer is suggested, however, because it allows for a greater flexibility in bonding the parts together with the proper alignment.

EXAMPLE

Usually, the electrodes 34 and 36 and the semiconductor body 32 are fabricated separately, and then diffusion bonded together. The electrodes 34 and 36 are fabricated by, first, forming a tantalum body 40 of the desired size and shape. The body 40 is polished flat and cleaned, and then it is coated with a layer of palladium. The tantalum body 40 is best coated with palladium 42 by an electrochemical exchange reaction, as shown by the reaction $Ta + Pd^{++} \rightarrow Pd + Ta^{+++}$. In particular, the tantalum body 40 is plated by an immersion displacement process where the tantalum is dipped in a palladium salt solution acidified with hydrofluoric acid. The hydrofluoric acid removes the tantalum oxide surface layer and allows the palladium to be deposited upon the exposed tantalum metal. The reaction continues until all of the tantalum oxide is removed and replaced with a layer of palladium. Typically, the reaction lasts for about 30 to 60 seconds and deposits a palladium layer about 200 A. thick.

Any of a number of palladium salts, such as chlorides, bromides or more complex salts, may be used in the immersion displacement solution. Generally, the solution should contain about 0.4 grams of palladium per liter of solution, and it should be acidified with hydrofluoric acid. The amount of hydrofluoric acid is variable, and the resulting solution can have a pH anywhere from 4.5 to 0.8. For convenience, a suitable commercially prepared palladium salt solution may be obtained from the Bishop Chemical Co., Malvern, Pa. under the trade name of DNS palladium immersion solution, and it has the formula $K_2Pd(NO_2)_2SO_4$.

After the tantalum body 40 is removed from the solution, the palladium layer 42 is sintered into the tantalum. Typically, the plated body is heated at 600° C for about 10 minutes to sinter the palladium into the tantalum. The sintering should be done before the layer of bonding material 44 is deposited; otherwise, the palladium will tend to diffuse into the bonding material instead.

The layer of bonding material 44 is then deposited on the layer of palladium 42. In the present example, a layer of silver is deposited on the palladium by any of the methods well known in the prior art, such as evaporation or electrolytic deposition.

The gallium arsenide body 32 is fabricated in a similar manner as that of the electrodes 34 and 36. First, the gallium arsenide body 32 is immersion displacement plated with a layer of palladium 46 in the same manner as the tantalum body 40. The immersion displacement process serves to remove any oxides on the surface of the semiconductor and plate it with a layer of palladium 46. The palladium forms a highly conductive, adherent bond with the semiconductor and it also provides non-oxidized surface which can easily be soldered or bonded as desired. The gallium arsenide body is then coated with a layer of bonding material 48 in a similar manner as that of the electrodes 34 and 36.

The gallium arsenide body 32 is then placed between the two electrodes 34 and 36 with the solder layers 44 and 48 adjacent one another. The unit is then placed in a high pressure and temperature press and diffusion bonded together. Typically, the unit is heated to 550° C for 15 minutes at a pressure of 1500 pounds per square inch. The unit is then removed from the press and soldered to the heat sink by methods well known in the prior art.

I claim:

1. A semiconductor device comprising a semiconductor body of a III–V material and an ohmic electrode bonded thereto;
   said ohmic electrode comprising:
   - a layer of a gold free bonding material joined to said body;
   - a layer of palladium united to said bonding layer; and
   - a tantalum body united to said palladium layer.

2. A semiconductor device as in claim 1, wherein said semiconducting body is gallium arsenide.

3. A semiconductor device as in claim 1, wherein said bonding layer contains silver.

4. A semiconductor device as in claim 1, and further including a second layer of palladium united directly to said semiconductor body, and said bonding layer is disposed between and joins both of said palladium layers together.

5. A mounted semiconductor device comprising:
   - a metallic base plate;
   - a tantalum body bonded to said base plate;
   - a layer of palladium united to said tantalum body;
   - a layer of a gold free bonding material united to said layer of palladium; and
   - a semiconducting body of gallium arsenide, or other semiconductor having a similar coefficient of expansion to that of gallium arsenide, united to said bonding layer.

6. A mounted semiconductor device as in claim 5, wherein said bonding layer contains silver.

7. A mounted semiconductor device as in claim 5, wherein said semiconducting body has a second layer of palladium united directly to it, with said bonding layer disposed between and joining both of said palladium layers together.

* * * * *